United States Patent [19]

Shinohara

[11] Patent Number: 5,594,172
[45] Date of Patent: Jan. 14, 1997

[54] SEMICONDUCTOR ACCELEROMETER HAVING A CANTILEVERED BEAM WITH A TRIANGULAR OR PENTAGONAL CROSS SECTION

[75] Inventor: Toshiro Shinohara, Yokosuka, Japan

[73] Assignee: Nissan Motor Co., Ltd., Yokohama, Japan

[21] Appl. No.: 540,613

[22] Filed: Jun. 20, 1990

[30] Foreign Application Priority Data

Jun. 21, 1989 [JP] Japan .................................. 1-156836
Aug. 4, 1989 [JP] Japan .................................. 1-201360

[51] Int. Cl.⁶ .................................................. G01P 15/12
[52] U.S. Cl. ............................. 73/514.33; 73/514.36
[58] Field of Search ........................... 73/514.33, 514.36, 73/514.38, 514.21, 514.23, 514.32, 862.382, 862.474; 338/2, 5

[56] References Cited

U.S. PATENT DOCUMENTS 4,600,934   7/1986   Aine et al. ............................ 73/514.36
4,882,933  11/1989   Petersen et al. ...................... 73/514.38
5,121,633   6/1992   Murakami et al. ................... 73/514.36

OTHER PUBLICATIONS

Lynn Michelle Roylance et al., "A Batch–Fabricated Silicon Accelerometer", IEEE Electron Devices, vol. ED–26, No. 12, Dec. 1979, pp. 1911–1917.

*Primary Examiner*—John E. Chapman
*Attorney, Agent, or Firm*—Foley & Lardner

[57] ABSTRACT

A semiconductor accelerometer, including a weight and a cantilevered beam formed in a silicon semiconductor substrate as a frame having a (100) surface, and a strain sensing device formed in a surface portion near a support portion of the cantilevered beam, the silicon cantilevered beam having a triangular cross section defined by one (100) surface and two (111) surfaces or a pentagonal cross section defined by one (100) surface, two (110) surfaces and two (111) surfaces. A method for producing the semiconductor accelerometer is also disclosed.

10 Claims, 11 Drawing Sheets

SEMICONDUCTOR ACCELEROMETER HAVING A CANTILEVERED BEAM WITH A TRIANGULAR OR PENTAGONAL CROSS SECTION

BACKGROUND OF THE INVENTION

1. Field of the Invention

The present invention relates to a semiconductor accelerometer having a cantilevered beam formed on a semiconductor substrate and a method for producing the same.

2. Description of the Background Art

Recently, there has been developed a micro-miniature semiconductor accelerometer formed on a semiconductor substrate using thin film technology such as photolithographic technology similar to that employed in the fabrication of integrated circuits. Such a semiconductor accelerometer is designed to detect acceleration by sensing a resistance change due to the piezoresistance effect of a semiconductor film formed on a semiconductor substrate or a minute capacity change due to deflection of a cantilevered beam formed on the semiconductor substrate.

Since such a semiconductor accelerometer is formed using the thin film technology, as mentioned above, it has the excellent feature that it can be formed extremely small in size, for instance, with a length of approximately 100 μm, a thickness of approximately 1 μm, of a vibrating portion, and an overall chip size of approximately 1 mm square, and in addition, that it can be formed on the same substrate for integrated circuits with other elements.

One example of a conventional semiconductor accelerometer is described in "A Batch-Fabricated Silicon Accelerometer", IEEE Electron Devices, Vol. ED-26, No. 12, Dec. 1979, pp. 1911–1917, as shown in FIGS. 1a to 1c.

In the conventional semiconductor accelerometer, as shown in FIGS. 1a to 1c, an n-type silicon semiconductor substrate as a frame 21 is processed in a conventional manner to form a C-shape-like gap 24 in the middle portion to obtain a cantilevered beam 22 and a mass or weight 23, and a piezoresistor 25 of a diffused resistor is formed in the surface near the support portion of the cantilevered beam 22.

In this case, when an acceleration is applied to the accelerometer, the weight 23 is deflected to cause a distortion in the cantilevered beam 22. As a result, the piezoresistor 25 changes the resistance value due to the piezoresistance effect, and the resistance value change is detected to obtain the acceleration given to the accelerometer. Hence, high processing accuracy is required in formation of the cantilevered beam 22.

In FIGS. 2a to 2e, there is shown a method for producing the conventional semiconductor accelerometer shown in FIGS. 1a to 1c.

In FIG. 2a, after the formation of a diffused resistor or piezoresistor (not shown) in the upper surface of an n-type silicon semiconductor substrate 31 as a frame, upper and lower silicon oxide films 32 and 33 are formed on the upper and lower surfaces of the substrate 31 to cover the entire upper and lower surfaces. The lower silicon oxide film 33 is partially removed by photoetching to form opening portions 34 and 35 for forming a cantilevered beam portion and a lower gap, respectively.

In FIG. 2b, the anisotropic etching of the lower surface of the substrate 31 is carried out with the lower silicon oxide film 33 as the mask by using an etching solution including potassium hydroxide (KOH). In this case, the control of the thickness of the cantilevered beam portion is performed by regulating the temperature of the etching solution and the duration for etching.

In FIG. 2c, the upper silicon oxide film 32 is partially removed by the photoetching to form an opening portion 36 for forming an upper gap.

In FIG. 2d, the anisotropic etching of the substrate 31 is carried out using the upper and lower silicon oxide films 32 and 33 as the mask in the same manner as the step shown in FIG. 2b until a gap 38 penetrating the substrate 31 is formed.

In FIG. 2e, the upper and lower silicon oxide film 32 and 33 are removed by etching to form a cantilevered beam 37 and a weight 39, the gap 38 defining the external form of the cantilevered beam 37 and the weight 39.

In this method, it is very difficult to perform a precise control of the thickness of the cantilevered beam, and the thickness of the cantilevered beam varies widely.

In order to remove this problem, another method using an electrochemical etching stop technique for producing a semiconductor accelerometer has been proposed, as shown in FIGS. 3a to 3g.

In FIG. 3a, an n-type epitaxial layer 42 is formed on the upper surface of a p-type silicon semiconductor substrate 41, and an upper silicon oxide film 43 is formed on the epitaxial layer 42.

In FIG. 3b, a p-type diffusion region 44 is formed in the epitaxial layer 42 by doping an impurity.

In FIG. 3c, the upper silicon oxide film 43 is partially removed in the same manner as described above to form an opening portion 45 for forming an n-type silicon contact portion.

In FIG. 3d, an electrode 46 is formed over the entire upper surface of the resulted substrate.

In FIG. 3e, a lower silicon oxide film 47 to be used as a mask for etching is formed on the lower surface of the substrate 41, and the lower silicon oxide film 47 is partially removed in the same manner as described above to form opening portions 48 and 49 for forming a cantilevered beam portion and a gap, respectively.

Then, the etching of the resulted substrate will be carried out by using the electrochemical etching stop technique.

In FIG. 4, there is shown an etching apparatus for use in the electrochemical etching. An etching bath 57 contains an alkaline etching solution 54 including hydrazine hydrate or KOH, and the resulted substrate 53 shown in FIG. 3e and a cathode 55 are immersed in the etching solution 54. The substrate 53 and the cathode 55 are connected to respective positive and negative electrodes of a power source 56 to effect the electrochemical etching. In this case, by utilizing the corrosive voltage difference between the p-type regions 41 and 44 and the n-type region 42, only the p-type regions can be selectively etched.

In FIG. 3f, the electrochemical etching is carried out in the lower surface of the substrate 41 using the lower silicon oxide film 47 as the mask, as described above, and the etching is stopped at the pn junction between the p-type substrate 41 and the n-type epitaxial layer 42 to selectively etch only the p-type regions 41 and 44. Hence, a cantilevered beam 50 and a weight 51 are formed, and a gap 52 of the etched p-type diffusion region 44 is arranged between the weight 51 and the substrate 41.

In FIG. 3g, the electrode 46 is removed to finish the semiconductor accelerometer shape processing. The upper and lower silicon oxide films 43 and 47 are removed.

In this method, since the pn junction is used as the etching stopper, the control of the thickness of the cantilevered beam can be readily achieved. However, the electrochemical etching method is used, and the electrode for applying the voltage during the electrochemical etching process is formed on the substrate. Further, the electrochemical etching is sensitive to the positional relation between the substrate and the cathode in the etching solution, and thus it is difficult to carry out the batch processing. Hence, in this case, an increase in cost is obtained.

In general, in order to improve the sensitivity of the accelerometer, the cross section of the cantilevered beam is preferably small within the limit of the strength allowed. In conventional semiconductor accelerometers, the cross section of the cantilevered beam is approximately a rectangular shape, and there is a problem in strength when the cantilevered beam is minimized.

In FIGS. 5a and 5b, there is shown a mounting structure of the semiconductor accelerometer shown in FIG. 1, including lower and upper stoppers 26 and 27 mounted to the lower and upper surfaces of the substrate 21 for preventing the cantilevered beam 22 from fracture due to an excessive acceleration to be applied to the beam 22 when, for example, dropping the accelerometer or the like.

However, such a conventional semiconductor accelerometer or mounting structure has the following problems.

Firstly, in the manufacturing process of the accelerometer, no protector for stopping the excessive displacement of the weight is provided after the formation of the cantilevered beam before the formation of the stoppers. Hence, the accelerometer must be handled carefully so as not to break the cantilevered beam, and productivity is largely lowered.

Secondly, the stopper forming process is complicated and costly. One of reasons why the accelerometer is formed from the semiconductor is to intend cost reduction per chip by fabricating many chips using a batch process, i.e., many chips are formed on a wafer and are processed in the same time to obtain the chips with stable quality and low cost. However, since the stoppers are attached to the upper and lower surfaces of the accelerometer after the formation of the cantilevered beam in the wafer process, as shown in FIGS. 5a and 5b, the advantage of the batch fabrication is lost and the cost increases largely.

Thirdly, it is difficult to form the stoppers accurately. To meet design requirements of the cantilevered beam, the gaps between the stoppers and the weight are controlled to be accurately formed as small as several μm to several tens μm in the structure shown in FIGS. 5a and 5b. The stoppers are required to be formed accurately and attached to the accelerometer precisely. Hence, high technology in preparing and bonding the stoppers cause the increase in cost.

Further, in the conventional accelerometer described above, an additional metal weight may be attached onto the silicon weight 23 in order to minimize the sensitivity of another axis, but the thickness of this additional metal weight tends to vary and to deteriorate the accuracy of the gap between the stoppers and the metal weight on the silicon weight. It is difficult to realize the stoppers with high accuracy effects.

SUMMARY OF THE INVENTION

Accordingly, it is an object of the present invention to provide a semiconductor accelerometer in view of the aforementioned defects and disadvantages of the prior art, which is capable of improving accuracy of the semiconductor accelerometer, improving sensitivity of the semiconductor accelerometer, improving strength of a cantilevered beam and the semiconductor accelerometer itself, improving productivity of the semiconductor accelerometer and manufacturing in a simple manner at low cost.

It is another object of the present invention to provide a method for producing a semiconductor accelerometer, free from the aforementioned defects and disadvantages of the prior art, which is capable of improving accuracy of the semiconductor accelerometer, improving sensitivity of the semiconductor accelerometer. improving strength of a cantilevered beam, improving productivity of the semiconductor accelerometer and the semiconductor accelerometer itself and manufacturing in a simple manner at low cost.

In accordance with one aspect of the present invention, there is provided a semiconductor accelerometer, comprising a silicon semiconductor substrate as a frame having a (100) surface, a weight formed in the substrate and surrounded by the substrate with a gap therebetween, a silicon cantilevere beam formed in the substrate for connecting the weight to the substrate, and a strain sensing device formed in a surface portion near a support portion of the cantilevered beam, the silicon cantilevered beam having a triangular cross section defined by one (100) surface and two (111) surfaces.

In accordance with another aspect of the present invention, there is provided a semiconductor accelerometer, comprising a silicon semiconductor substrate as a frame having a (100) surface, a weight formed in the substrate and surrounded by the substrate with a gap therebetween, a silicon cantilevered beam formed in the substrate for connecting the weight to the substrate, and a strain sensing device formed in a surface portion near a support portion of the cantilevered beam, the silicon cantilevered beam having a pentagonal cross section defined by one (100) surface, two (110) surfaces and two (111) surfaces.

In accordance with a further aspect of the present invention, there is provided a method for producing a semiconductor accelerometer, comprising the steps of forming at least two trenches having side surface of (110) surface and a bottom of (100) surface in a surface area of a silicon semiconductor substrate having a (100) surface, and carrying out anisotropic etching of the side surfaces and the bottom of the trenches in an alkaline etching solution to form etching holes having side surfaces of (111) surface and a cantilevered beam having a triangular cross section defined by one (100) surface and two (111) surfaces.

In accordance with still another aspect of the present invention, there is provided a method for producing a semiconductor accelerometer, comprising the steps of forming at least two p-type silicon regions in trench forming portions of a surface area of a silicon semiconductor substrate having a (100) surface, forming at least two trenches having side surfaces of (110) surface and a bottom of (100) surface in the trench forming portions of the substrate, and carrying out anisotropic etching of the side surface and the bottom of the trenches in an alkaline etching solution to form etching holes having side surfaces of (111) surface and (110) surface and a cantilevered beam having a pentagonal cross section defined by one (100) surface, two (110) surfaces and two (111) surfaces.

In accordance with still another aspect of the present invention, there is provided a method for producing a semiconductor accelerometer including a silicon semiconductor substrate as a frame having a (100) surface, a weight formed in the substrate and surrounded by the substrate with a gap therebetween, a silicon cantilevered beam formed in the substrate for connecting the weight to the substrate, a strain sensing device formed in a surface portion near a support portion of the cantilevered beam, and stoppers formed between the substrate and the weight in both side portions and one end portions of the weight, each stopper including upper and lower stopper members having a triangular cross section defined by one (100) surface and two (111) surfaces and being arranged in the same direction as a bending direction of the weight with a certain gap between the upper and lower stopper members, the upper and lower stopper members projecting from the weight and the substrate, comprising the steps of forming a plurality of trenches having side surfaces of (110) surface and a bottom of (100) surface in a surface area of the substrate, and carrying out anisotropic etching of the side surfaces and the bottom of the trenches in an alkaline etching solution to form etching holes having side surfaces of (111) surface.

BRIEF DESCRIPTION OF THE DRAWINGS

These and other objects, features and advantages of the present invention will more fully appear from the following description of the preferred embodiments with reference to the accompanying drawings, in which:

FIGS. 1b and 1c are cross sections, taken along the respective lines Ib—Ib and Ic—Ic in FIG. 1a;

FIG. 5a is a perspective view of a mounting structure of the conventional accelerometer shown in FIG. 1a, FIG. 5b is cross section, taken along the line Vb—Vb in FIG. 5a;

FIGS. 6b to 6d are cross sections, taken along the lines VIb—VIb, VIc—VIc and VId—VId, respectively, in FIG. 6a;

FIGS. 7a to 7d are cross sections showing a method for producing the semiconductor accelerometer shown in FIG. 6a;

FIGS. 11b and 11c are cross sections, taken along the lines XIb—XIb and XIc—XIc, respectively, in FIG. 11a; and FIGS. 12a to 12d are cross sections showing a method for producing the semiconductor accelerometer shown in FIG. 11a.

DESCRIPTION OF THE PREFERRED EMBODIMENTS

Figure 1A:
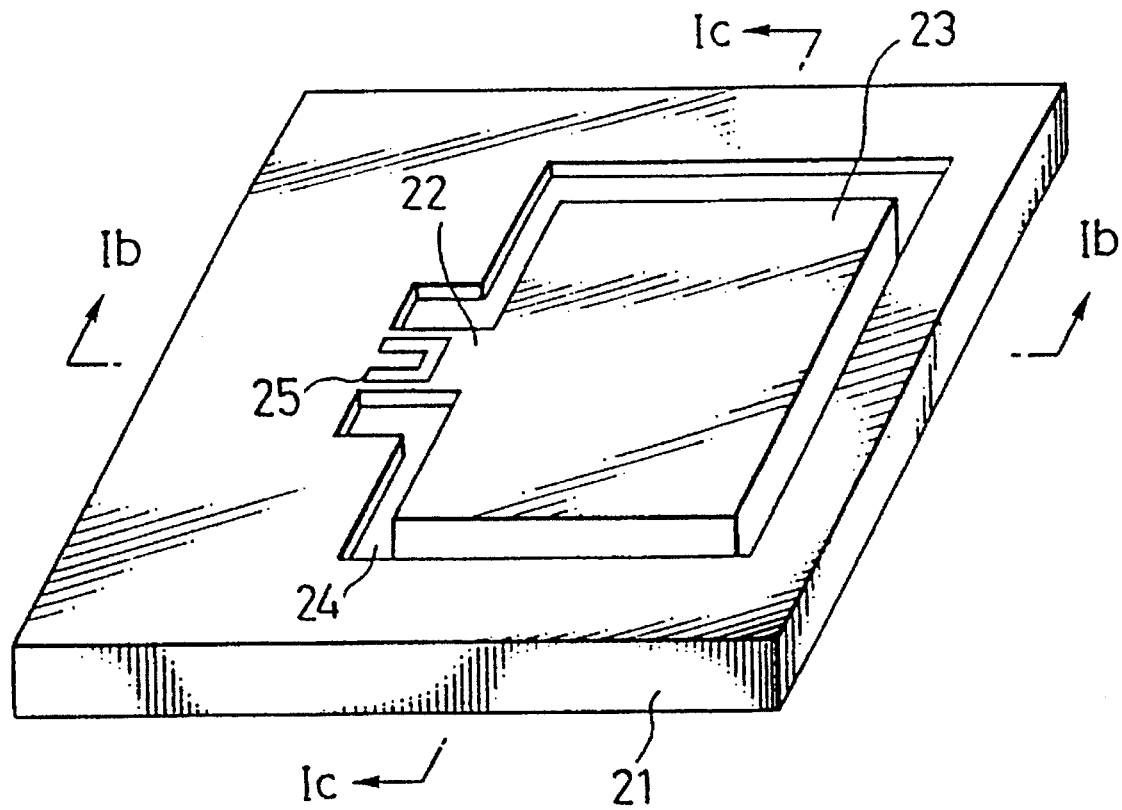
FIG. 1a is a perspective view of a conventional semiconductor accelerometer.
Figure 1B:
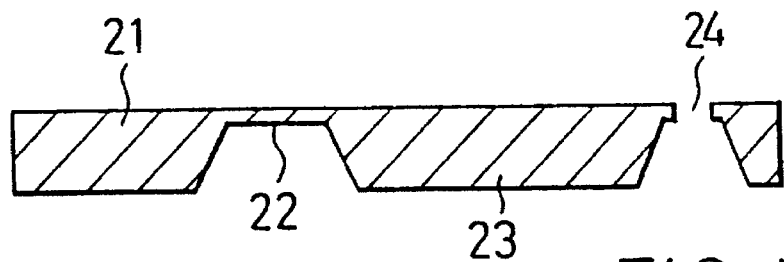
Figure 1C:
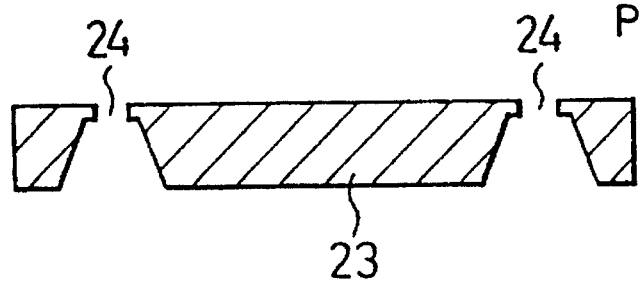
Figure 2A:
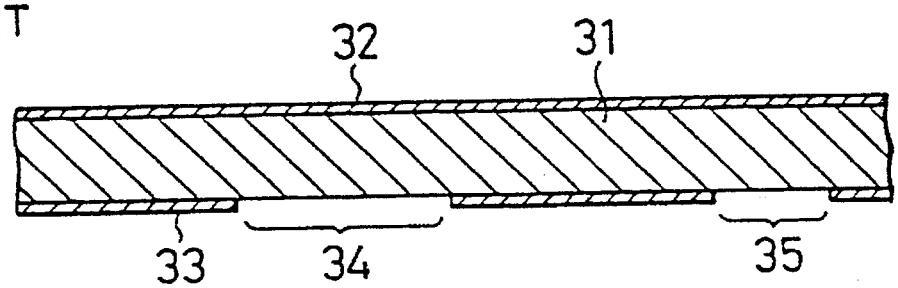
FIGS. 2a to 2e show a method for producing the conventional semiconductor accelerometer shown in FIGS. 1a to 1c.
Figure 2B:
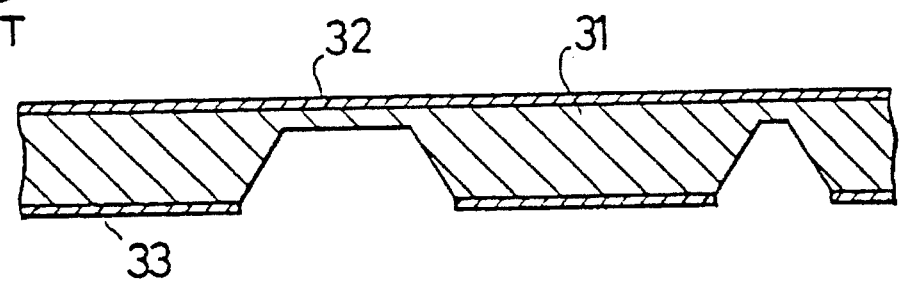
Figure 2C:
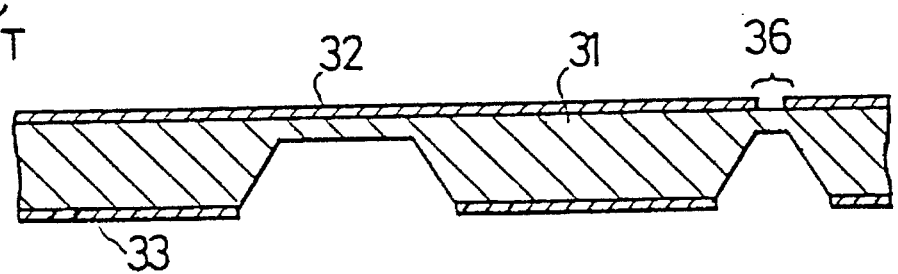
Figure 2D:
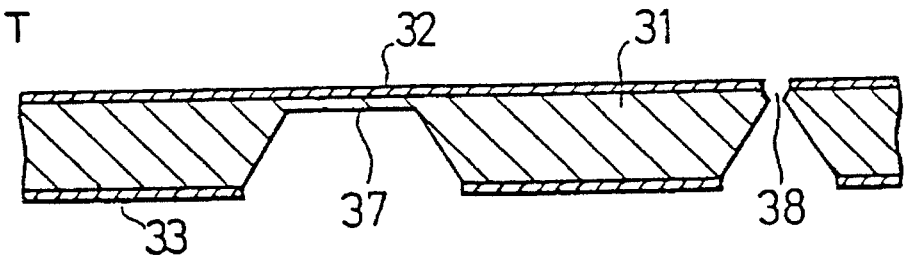
Figure 2E:
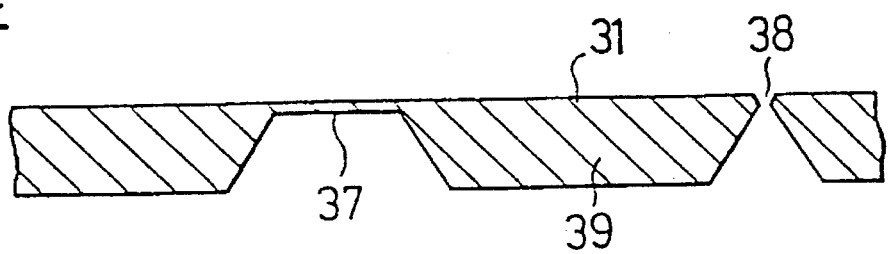
Figure 3A:
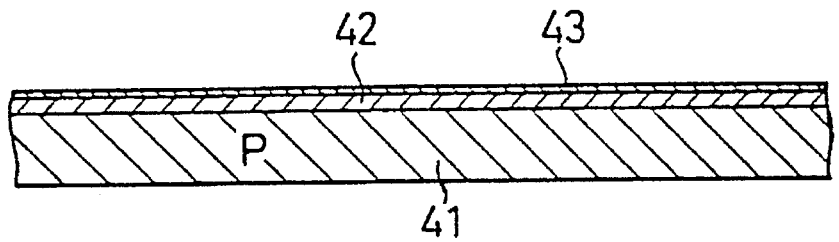
FIGS. 3a to 3g show another method for producing the conventional semiconductor accelerometer shown in FIGS. 1a to 1c.
Figure 3B:
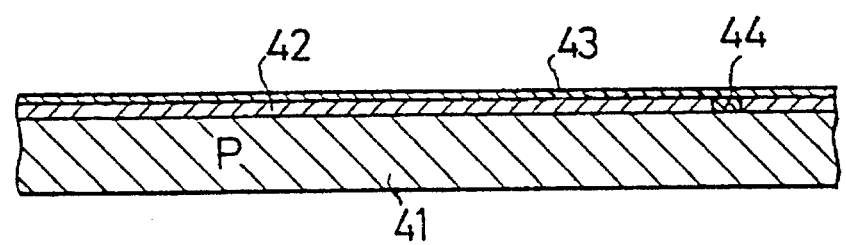
Figure 3C:
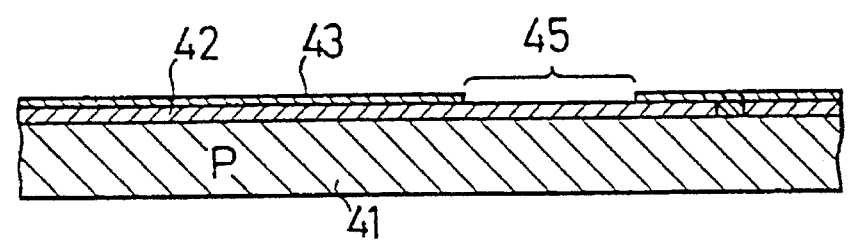
Figure 3D:
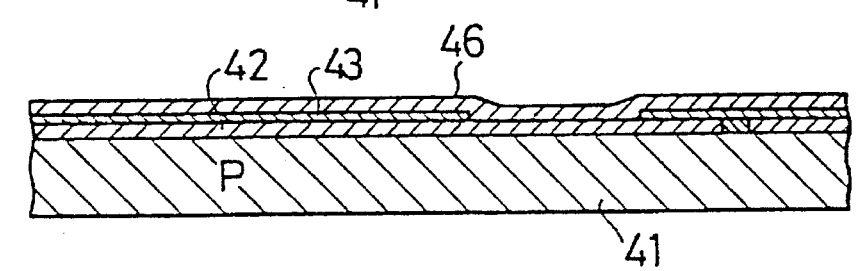
Figure 3E:
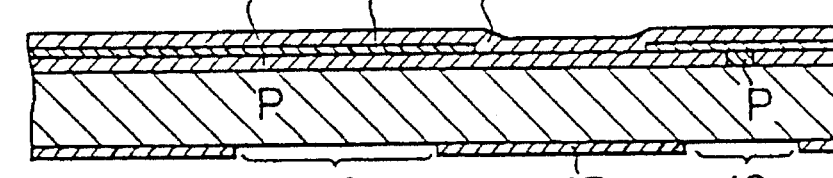
Figure 3F:
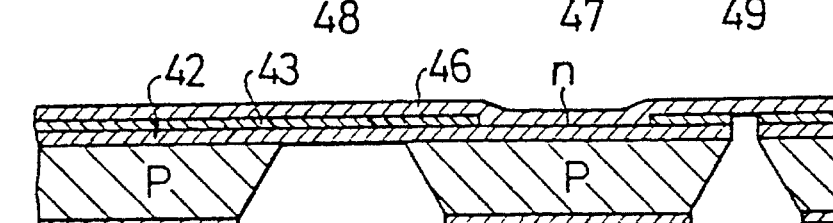
Figure 3G:
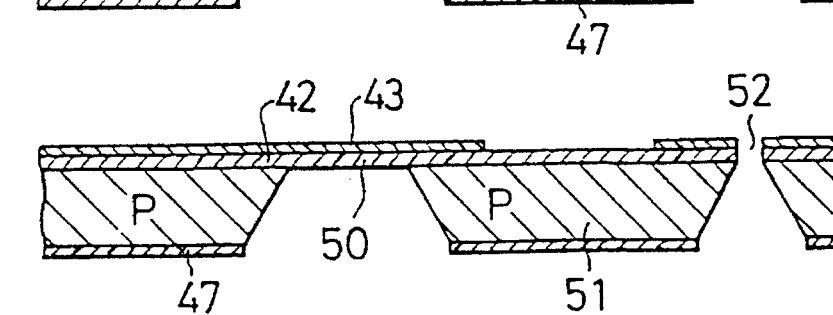
Figure 4:
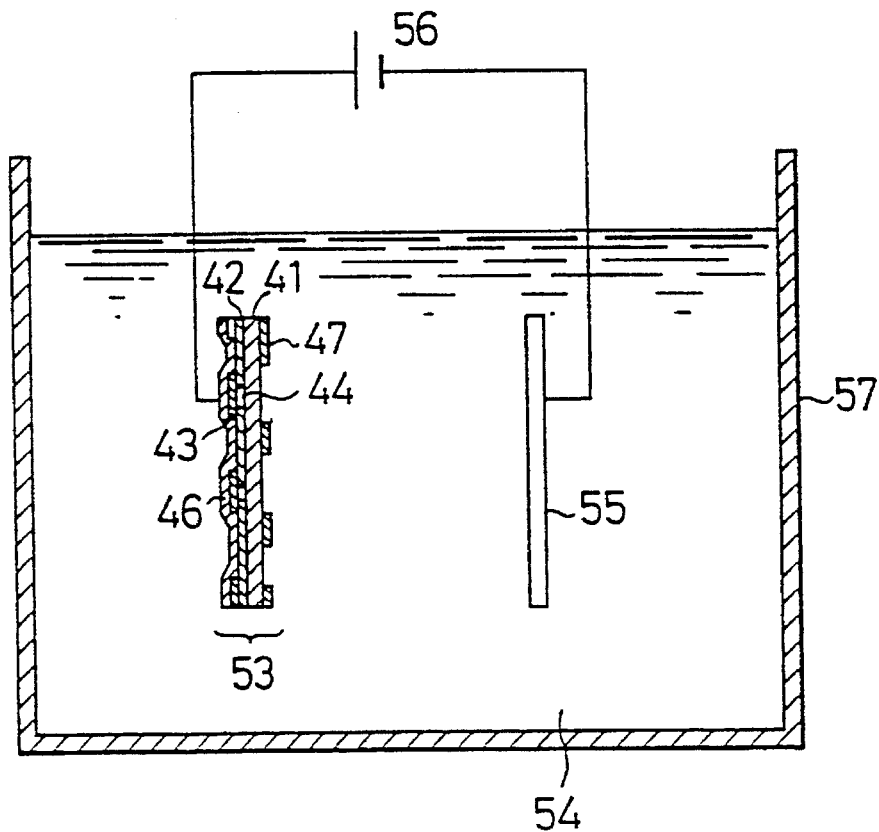
FIG. 4 is a schematic cross section of an electro-chemical etching apparatus used in the method shown in FIGS. 3a to 3g.

Referring now to the drawings, wherein like reference characters designate like or corresponding components throughout the several views and thus the repeated description can be omitted for the brevity, there is shown in FIGS. 6a to 6d the one embodiment of a semiconductor accelerometer according to the present invention.

As shown in FIGS. 6a to 6d, in the middle portion of a silicon semiconductor substrate 101 having a (100) surface, a C-shape-like gap 103 is formed so as to penetrate the substrate 101. The gap 103 defines the external shape of a cantilevered beam 104 having a cross section of an inverted triangle and a mass or weight 102 connected to the substrate 101 as a frame through the cantilevered beam 104. A piezoresistor 25 of a diffused resistor as a strain sensing device is formed in the surface near the support portion of the cantilevered beam 104.

Figure 6A:
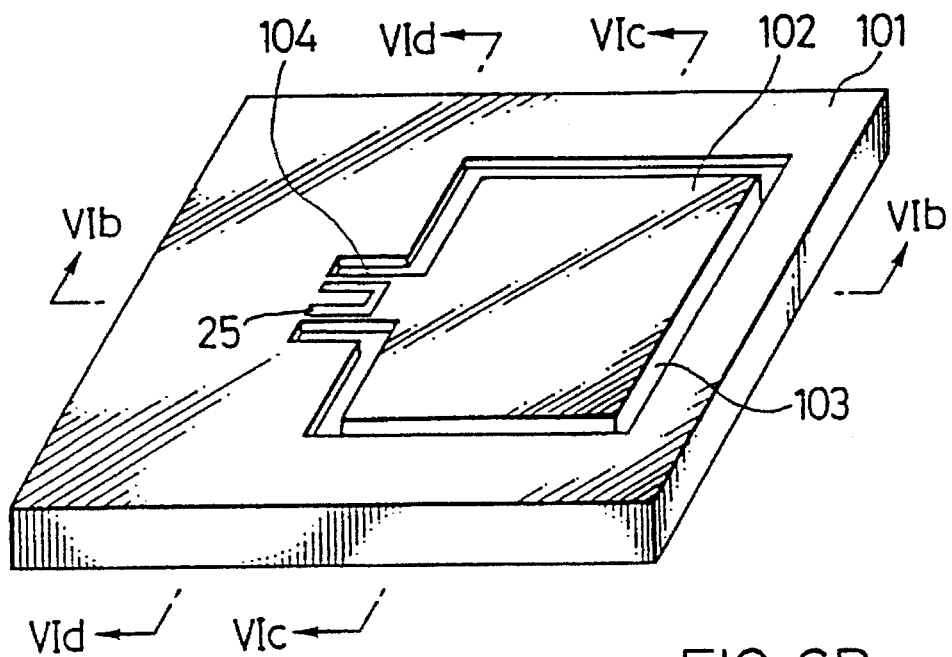
FIG. 6a is a perspective view of a semiconductor accelerometer according to the present invention.
Figure 6B:
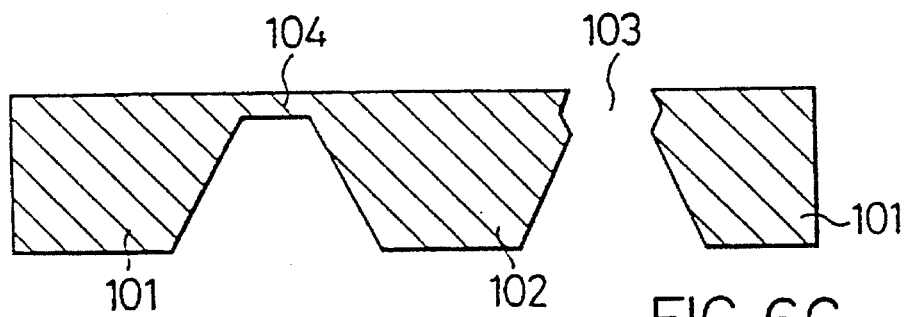
Figure 6C:
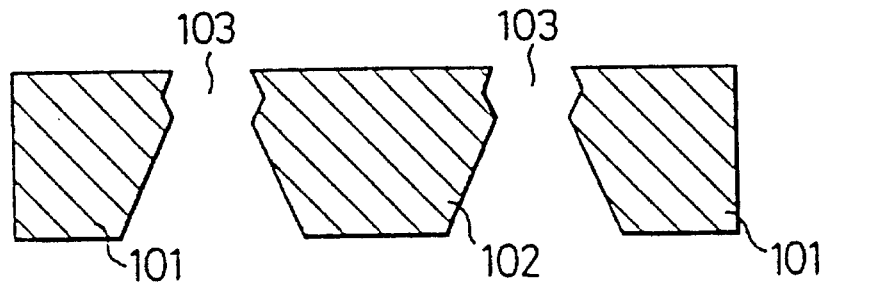
Figure 6D:
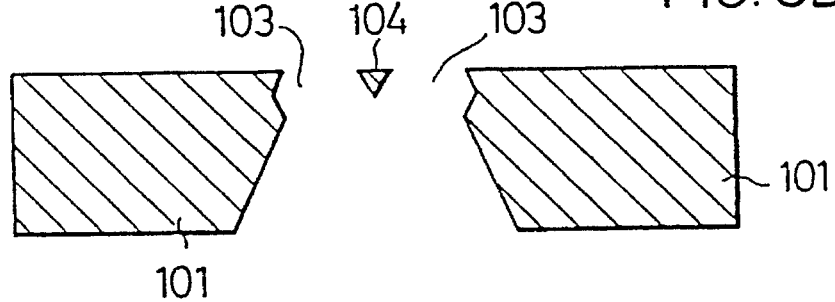

A method for producing the semiconductor accelerometer shown in FIG. 6a will be described in detail in connection with FIGS. 7a to 7d.

Figure 7A:
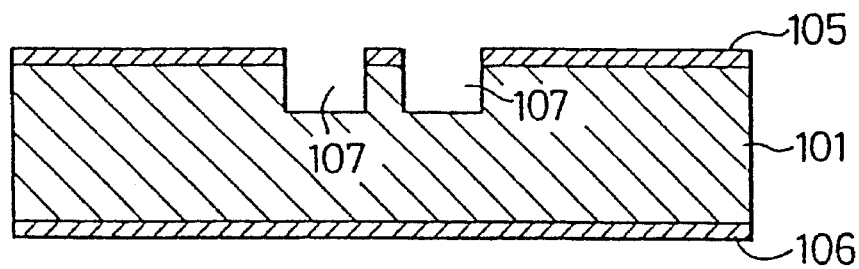

In FIG. 7a, after the formation of a diffused resistor or piezoresistor (not shown) in the upper surface of a silicon semiconductor substrate 101 as a frame having a (100) surface, upper and lower silicon oxide films 105 and 106 are formed on the upper and lower surfaces of the substrate 101 to cover the entire upper and lower surfaces. The upper silicon oxide film 105 is selectively removed by photoetching to form opening portions for forming trenches 107, and the etching of the upper surface of the substrate 101 is carried out using the upper silicon oxide film 105 as a mask by the reactive ion etching (RIE) using chlorine gas to form the trenches 107 having side surfaces of (110) surface in the upper surface area of the substrate 101.

Figure 7B:
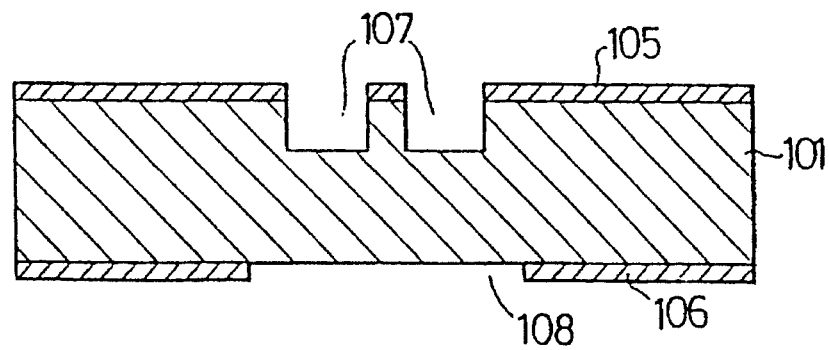

In FIG. 7b, the lower silicon oxide film 106 is selectively removed by the photoetching to form a opening portion 108 for forming a gap.

Figure 7C:
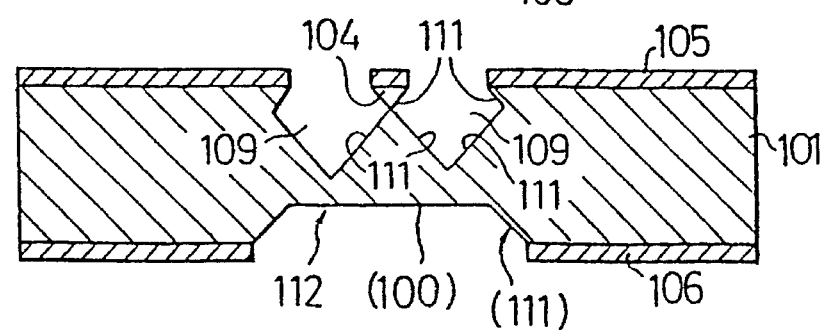

In FIG. 7c, an anisotropic etching of the resulted substrate 101 is carried out with the upper and lower silicon oxide films 105 and 106 as the mask by using an etching solution including potassium hydroxide (KOH). FIG. 7c shows an unfinished state of the etching. At this time, etching holes 109 surrounded by (111) surfaces 111 are formed in the upper half area of the substrate 101 and the etching is almost stopped. However, a (100) surface 112 is exposed or still remains in the lower half of the substrate 101. Hence, the etching is still continued.

Figure 7D:
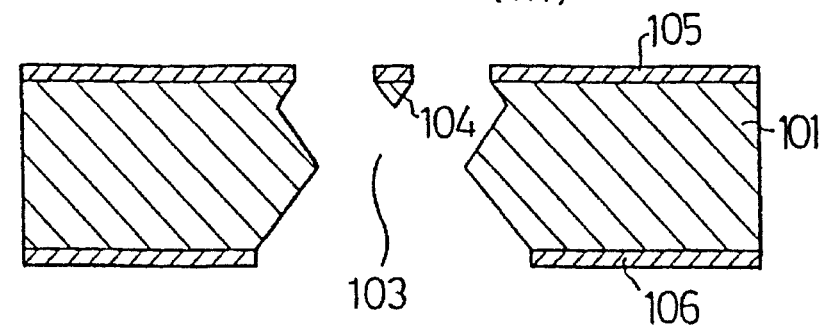

In FIG. 7d, the upper and lower etching holes are completely formed and the silicon remaining below a cantilevered beam 104 having an inverted triangle form is also completely removed to finish the etching. Thus, the upper and lower etching holes join together and penetrate the substrate 101, thereby forming a gap 103 which defines the external shape of the cantilevered beam 104 having the inverted triangular cross section defined or surrounded by one flat top (100) surface and two slant lower (111) surfaces. At the end of the etching, all side surfaces of the gap 103 become only the (111) surface.

The principle of the etching technique described above will now be described in detail in connection with FIG. 8.

Figure 8:
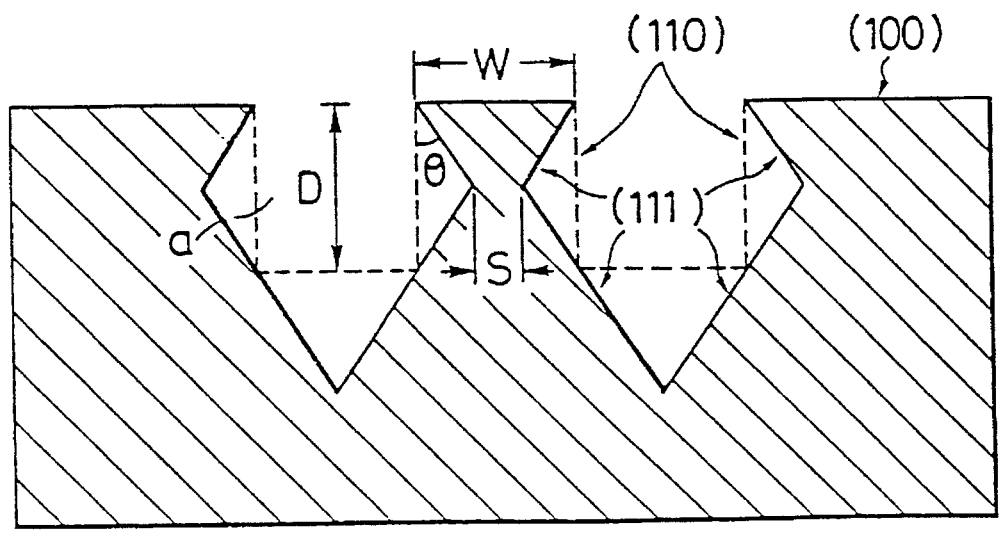
FIG. 8 is a cross section for explaining a principle of the present producing method.
Figure 5A:
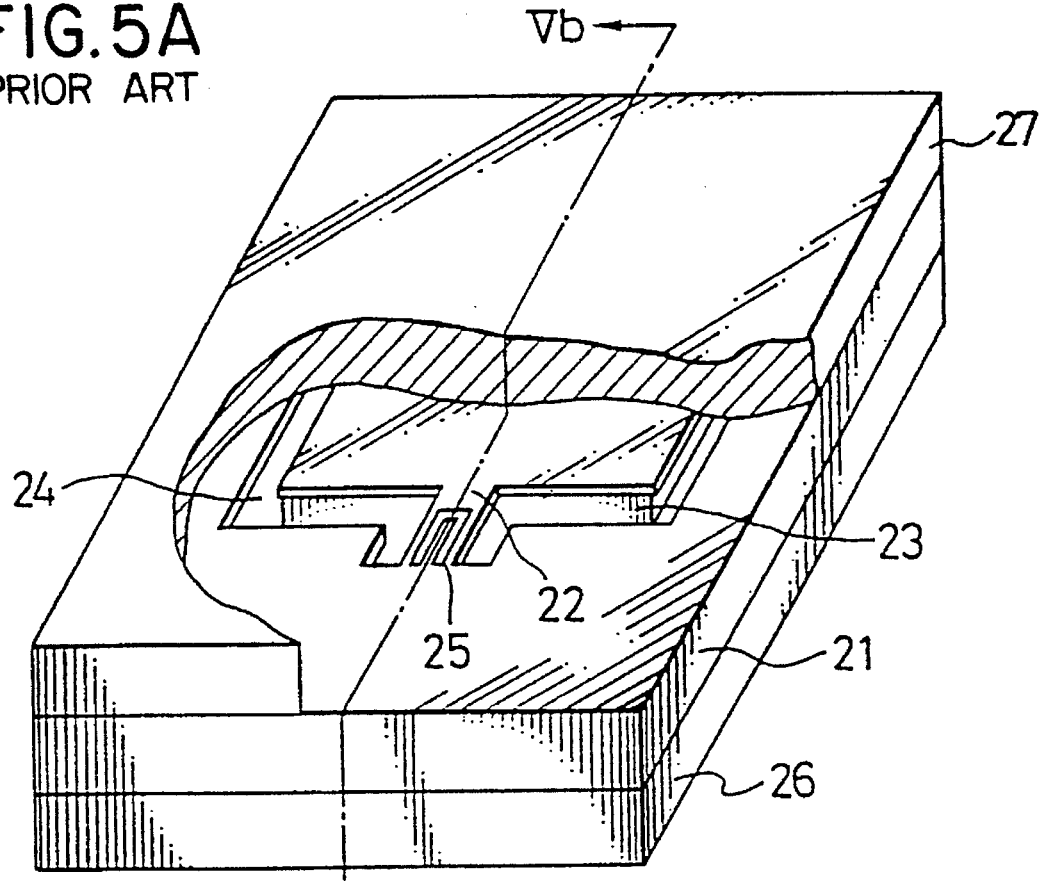
Figure 5B:
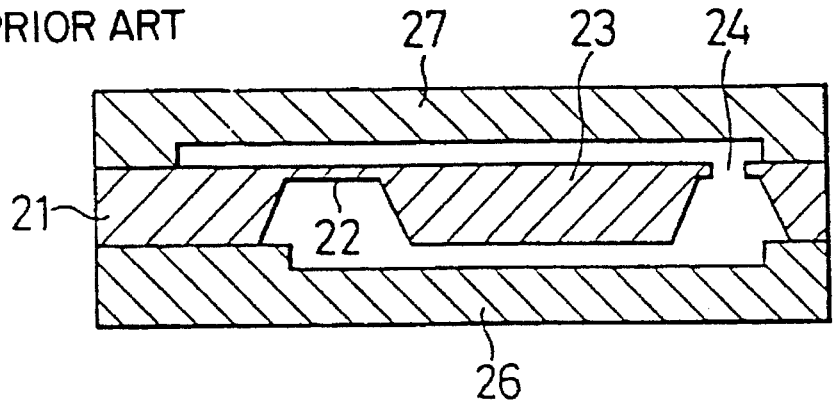

In FIG. 8, there is shown a cross section of a silicon semiconductor substrate where the plane direction of the upper surface is the (100) surface and the cross section is the plane direction of the (110) surface. Two trenches having side surfaces of the (110) surface, as shown by broken lines, are formed in the surface area of the substrate by the RIE. Then, the anisotropic etching of the substrate is to be carried out.

When the anisotropic etching of the substrate is carried out by using the etching solution including KOH, the ratio of the etching rate of the (110):(100):(111) surfaces are approximately 600:300:1. Therefore, the side surfaces of the trenches can be rapidly etched. The bottoms of the trenches are etched at a not so fast speed but can be etched until the (111) surfaces are exposed. When the four (111) surfaces are exposed, the etching is almost stopped or the etching speed becomes quite slow.

Now, assuming that a surface width of a silicon island or an interval between two trenches is W, that a depth of the trenches is D, that a width of a narrow part of the silicon island when the etching is stopped is S, and that an angle between (110) and (111) surfaces is θ (θ=35.26°), the following formula is satisfied:

$$W = S + D \tan \theta \quad (1)$$

Accordingly, one the values W, D and S can be readily determined. Hence, the accuracy of the cantilevered beam and the semiconductor accelerometer itself can be largely improved, and the sensitivity of the semiconductor accelerometer can be largely improved as well. Further, the strength of the cantilevered beam can be improved, and thus the cantilevered beam can be minimized. Also, the semiconductor accelerometer can be fabricated in a simple manner at low cost.

Another method for producing another embodiment of a semiconductor accelerometer according to the present invention will be described in detail with reference to FIGS. 9a to 9f.

Figure 9A:
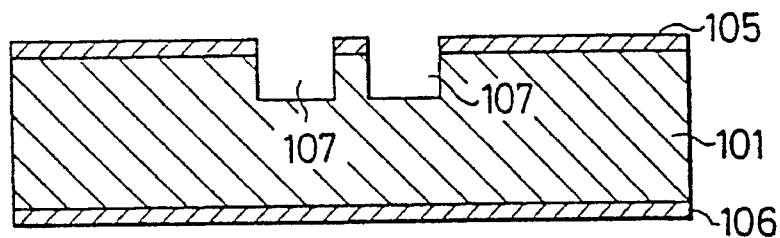
FIGS. 9a to 9f are cross sections showing another method for producing a semiconductor accelerometer according to the present invention.

In FIG. 9a, like the step shown in FIG. 7a, after the formation of a diffused resistor or piezoresistor (not shown) in the upper surface of a silicon semiconductor substrate 101 as a frame having a (100) surface, upper and lower silicon oxide films 105 and 106 are formed on the upper and lower surfaces of the substrate 101 to cover the entire upper and lower surfaces. The upper silicon oxide film 105 is selectively removed by photoetching to form opening portions for forming trenches 107, and the etching of the upper surface of the substrate 101 is carried out using the upper silicon oxide film 105 as a mask by the reactive ion etching (RIE) using chlorine gas to form the trenches 107 having side surfaces of (110) surface in the upper surface area of the substrate 101. In this embodiment, the dimension and position such as the interval W and depth D of the trenches 107 are so determined that the value S is negative according to the formula (1).

Figure 9B:
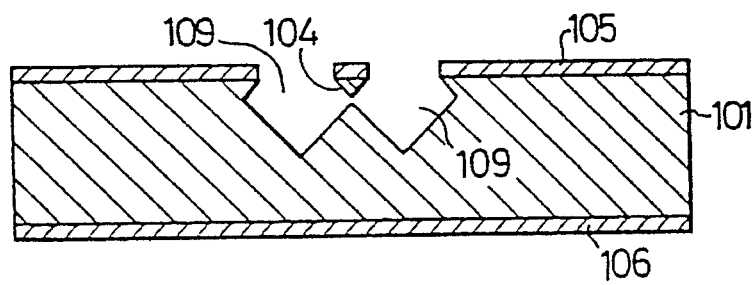

In FIG. 9b, an anisotropic etching of the resulted substrate 101 is carried out with the silicon oxide films 105 and 106 as the mask by using the etching solution including KOH in the same manner as described above to form upper etching holes 109 which constitute a gap defining the lower surfaces of a cantilevered beam 104 and separating the cantilevered beam 104 from the substrate 101.

Figure 9C:
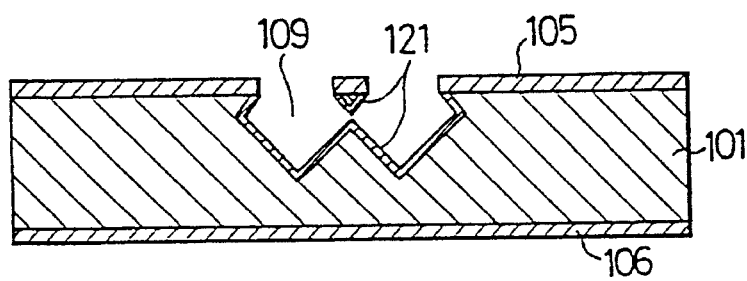

In FIG. 9c, the surfaces of the upper etching holes 109 formed in the substrate 101 are oxidized by the thermal oxidation to form silicon oxide films 121 for protecting the cantilevered beam 104 from the etching.

Figure 9D:
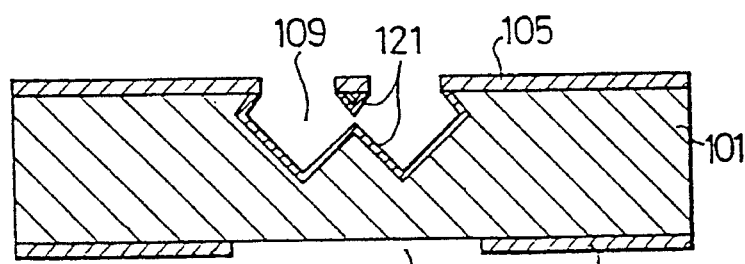

In FIG. 9d, like the step shown in FIG. 7b, the lower silicon oxide film 106 is selectively removed by the photoetching to form a opening portion 108 for forming a gap.

Figure 9E:
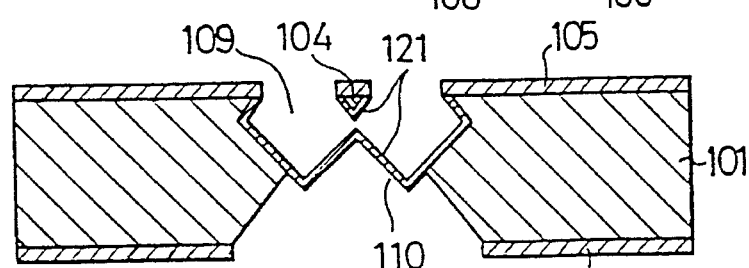

In FIG. 9e, the anisotropic etching of the resulted substrate 101 is carried out by using the upper and lower silicon oxide films 105 and 106 and the thermal silicon oxide films 121 as the mask in the same manner as described above to form a lower etching hole 110 up to the thermal silicon oxide films 121. In this etching process, the surface of the cantilevered beam 104 is protected by the thermal silicon oxide films 121 and is not etched.

Figure 9F:
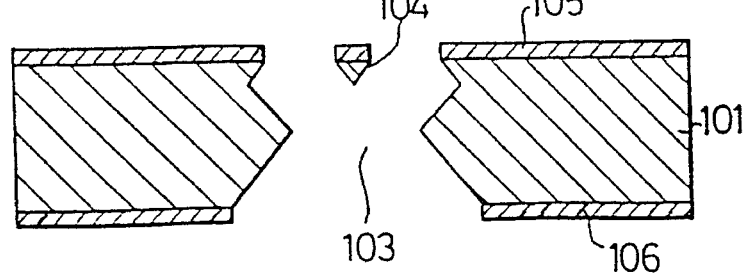

In FIG. 9f, the thermal silicon oxide films 121 are removed from the lower surface of the cantilevered beam 104 and the internal surfaces of the etching holes 109 to finish the shape processing of a semiconductor accelerometer according to the present invention.

In this embodiment, the same effects and advantages as those of the first method described above can be obtained. In addition, in the upper etching hole forming step, as shown in FIG. 9b, there is no need to leave a narrow silicon island coupling between the cantilevered beam 104 and the substrate 101, as shown in FIG. 8, and the maximum permissible limit of the dimensional accuracy of the interval W between the trenches and the depth D thereof can be improved. Hence, it is advantageous to manufacture the cantilevered beam and the semiconductor accelerometer.

A further method for producing a further embodiment of a semiconductor accelerometer according to the present invention will be described in detail in connection with FIGS. 10a to 10c. In this embodiment, a cantilevered beam has a cross section of a pentagon.

Figure 10A:
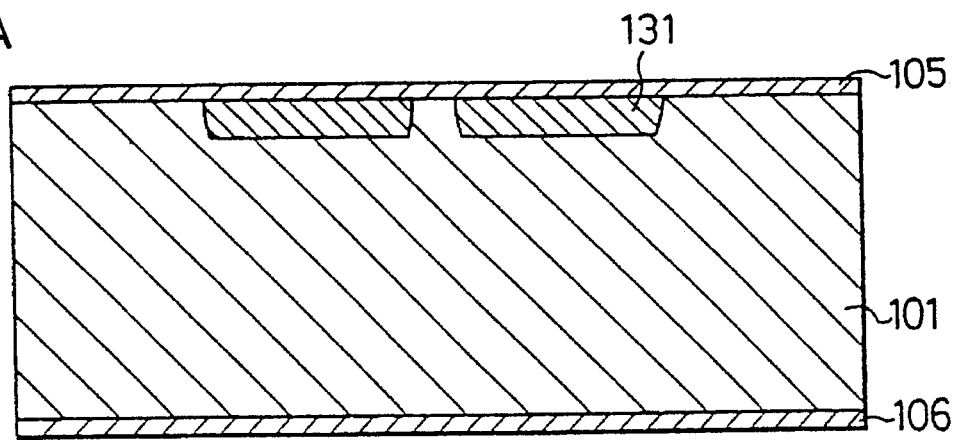
FIGS. 10a to 10c are cross sections showing a further method for producing another semiconductor accelerometer according to the present invention.

In FIG. 10a, after the formation of a diffused resistor or piezoresistor (not shown) in the upper surface of a silicon semiconductor substrate 101 as a frame having a (100) surface, two p-type high concentration silicon regions 131 are formed in the surface area of the substrate 101 by an ion implantation method so that the width of each p type region 131 is larger than that of each trench formation region. Then, upper and lower silicon oxide films 105 and 106 are formed on the upper and lower surfaces of the substrate 101 to cover the entire upper and lower surfaces.

Figure 10B:
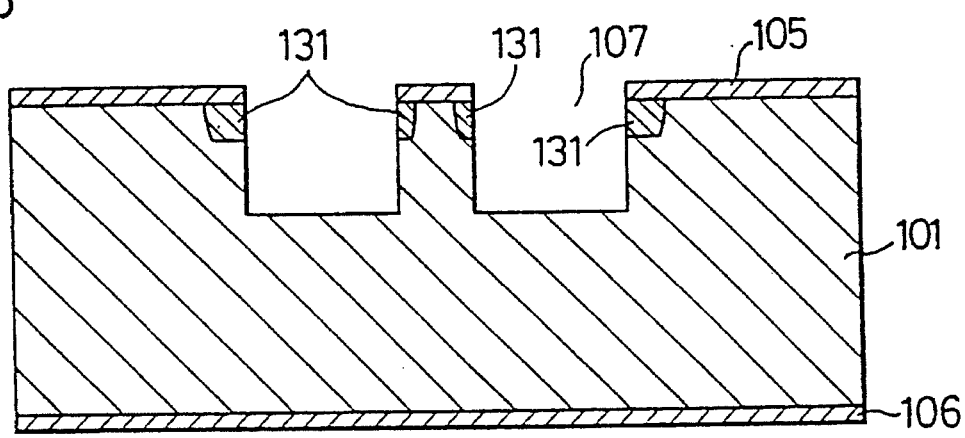

In FIG. 10b, the upper silicon oxide film 105 is selectively removed by photoetching to form opening portions for forming trenches 107, and the etching of the upper surface of the substrate 101 is carried out using the upper silicon oxide film 105 as a mask by the reactive ion etching (RIE) using chlorine gas to form the trenches 107 having side surfaces of (110) surface in the upper surface area of the substrate 101. In this step, the p-type regions 131 remain in the upper surface area of the substrate so as to define the upper portions of the trenches 107.

Figure 10C:
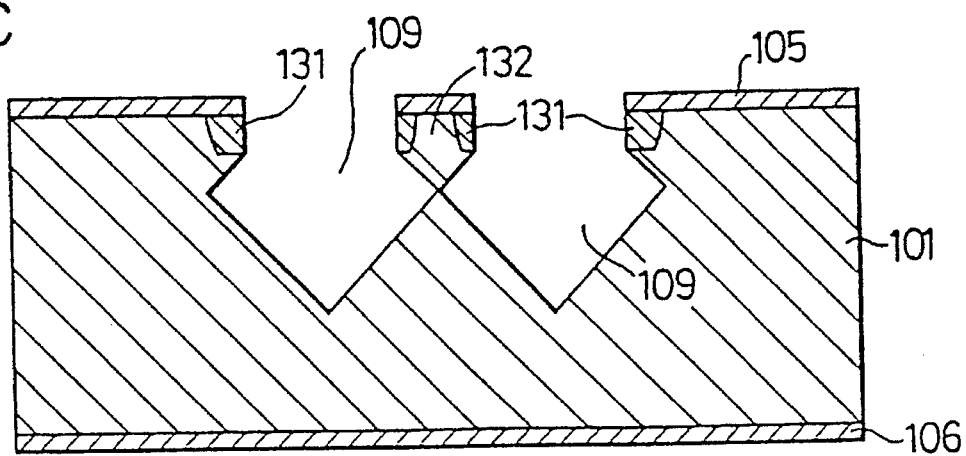

In FIG. 10c, an anisotropic etching of the resulted substrate 101 is carried out with the silicon oxide films 105 and 106 as the mask by using the etching solution including KOH in the same manner as described above to form upper etching holes 109. In this step, the etching speed of the p-type high concentration silicon regions 131 by the etching solution including KOH is quite slow, and hence a cantilevered beam 132 having a pentagonal cross section defined or surrounded by one flat top (100) surface, two vertical intermediate (110) surfaces and two slant lower (111) surfaces is obtained.

Then, the resulted substrate is processed in the same manner as described above to finish the shape formation of a semiconductor accelerometer according to the present invention. In this case, the p-type regions 131 may be removed as occasion demands.

In this embodiment, the same effects and advantages as those of the first embodiment can be obtained. In addition, the cross sectional area of the cantilevered beam can be increased, and the strength of the cantilevered beam can be improved. Thus, the degree of freedom on the mechanical design of the cantilevered beam and the degree of freedom on the design of the chip formed on the cantilevered beam can be largely improved.

Figure 11A:
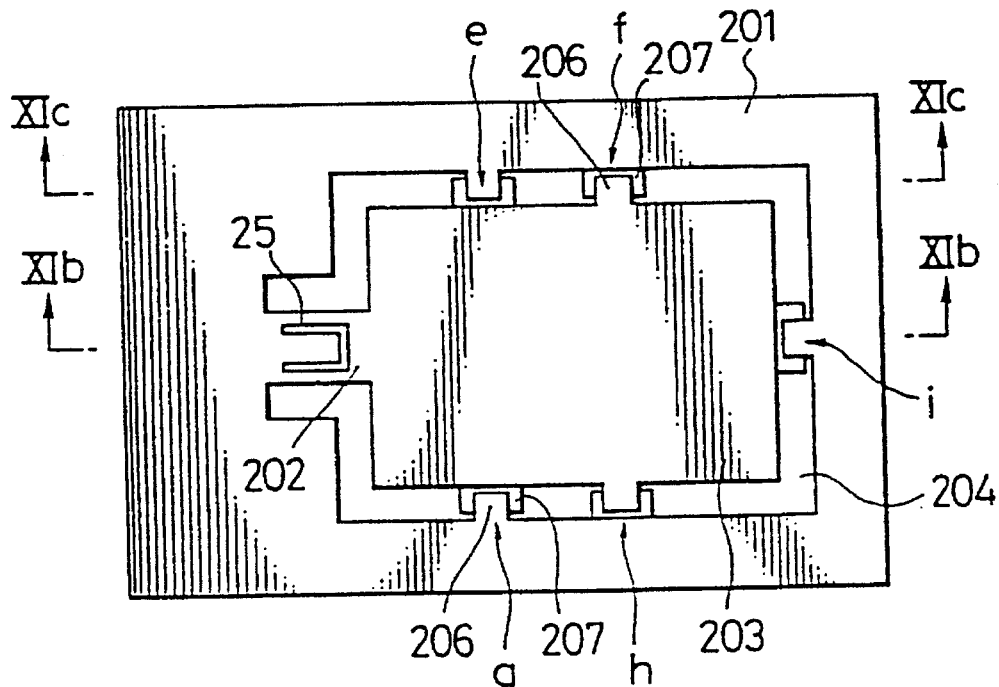
FIG. 11a is a top view of still another semiconductor accelerometer according to the present invention.
Figure 11B:
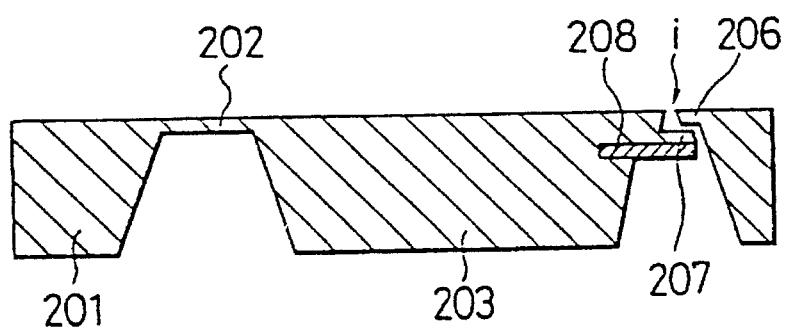
Figure 11C:
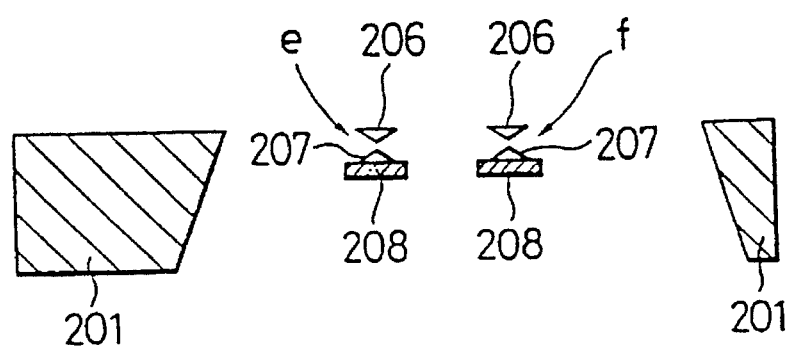

In FIGS. 11a to 11c, there is shown still another embodiment of a semiconductor accelerometer according to the present invention.

As shown in FIGS. 11a to 11c, in the middle portion of a silicon semiconductor substrate 201 as a frame having a (100) surface, a C-shape-like gap 204 is formed so as to penetrate the substrate 201 to form a cantilevered beam 202 and a mass or weight 203 connected to the substrate 201 via the cantilevered beam 202. The gap 204 defines the external shape of the cantilevered beam 202 and the weight 203, and the cantilevered beam 202 and the weight 203 are surrounded by the substrate 201 via the gap 204. A piezoresistor 25 of a diffused resistor is formed in the surface near the support portion of the cantilevered beam 202.

In this embodiment, five stoppers e, f, g, h and i for protecting the cantilevered beam 202 from excess bending or breaking due to the excess acceleration given to the weight 203 are provided in both sides of the weight 202 and one end thereof opposite to the cantilevered beam 202 between the substrate 201 and the weight 203. Each stopper is composed of upper and lower stopper members 206 and 207 having approximately a triangular cross section, and the upper and lower stopper members 206 and 207 are arranged in the same direction as the bending direction of the weight 203 with a certain space or gap between the upper and lower stopper members 206 and 207.

In the stoppers e, g and i for stopping the excess moving of the weight 203 in the upper direction, each upper stopper member 206 projects from the substrate 201 and each lower stopper member 207 projects from the weight 203. In the stoppers f and h for stopping the excess moving of the weight 203 in the lower direction, each upper stopper member 206 projects from the weight 203 and each lower stopper member 207 projects from the substrate 201. A $p^+$-type silicon region 208 is formed under each lower stopper member 207. Therefore, even when an excess acceleration is applied to the weight 203, the excess moving of the weight 203 is stopped by the stoppers to exactly prevent the breaking of the cantilevered beam 202.

A method for producing the semiconductor accelerometer shown in FIGS. 11a to 11c will be described in detail with reference to FIGS. 12a to 12d.

Figure 12A:
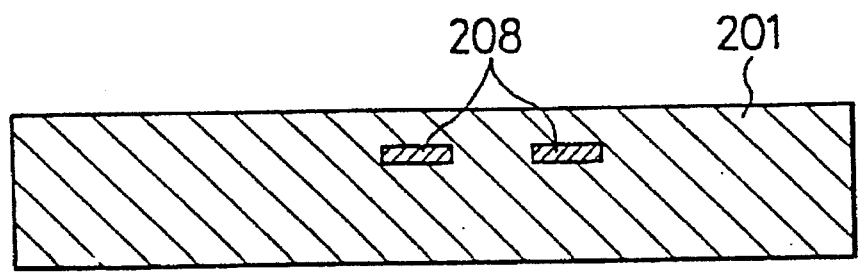

In FIG. 12a, after the formation of a diffused resistor or piezoresistor (not shown) in the upper surface of a silicon semiconductor substrate 201 having a (100) surface, $p^+$-type silicon regions 208 are formed in stopper forming portions of the substrate 201 in suitable depth. This is performed by doping a $p^+$-type impurity into the surface area of the substrate 201 in the stopper forming portions thereof to form the $p^+$-type silicon regions 208 in the surface area of the substrate 201 and growing an epitaxial silicon layer on the surface of the resulted substrate 201 by the epitaxial growing method.

Figure 12B:
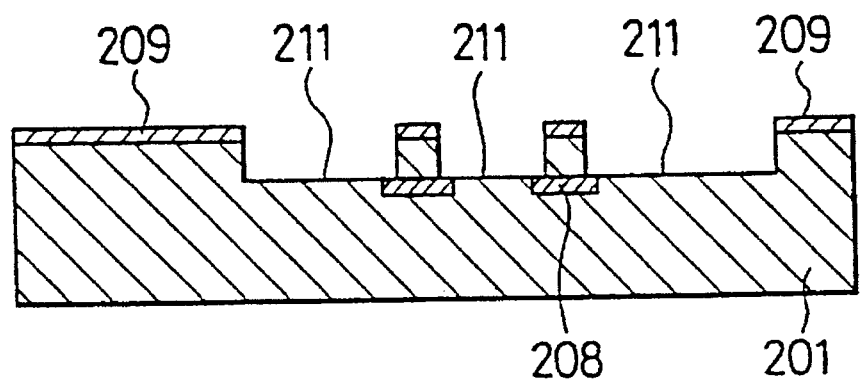

In FIG. 12b, an upper silicon oxide film 209 is formed on the upper surface of the substrate 201, and the upper silicon oxide film 209 is selectively removed by photoetching to form opening portions for forming trenches 211. Then, the etching of the upper surface of the substrate 201 is carried out using the upper silicon oxide film 105 as a mask by the RIE in the same manner as described above to form the trenches 211 having side surfaces of (110) surface in the upper surface area of the substrate 201. The depth of the trenches 211 is determined to approximately the same as that reaching the $p^+$-type silicon regions 208.

Figure 12C:
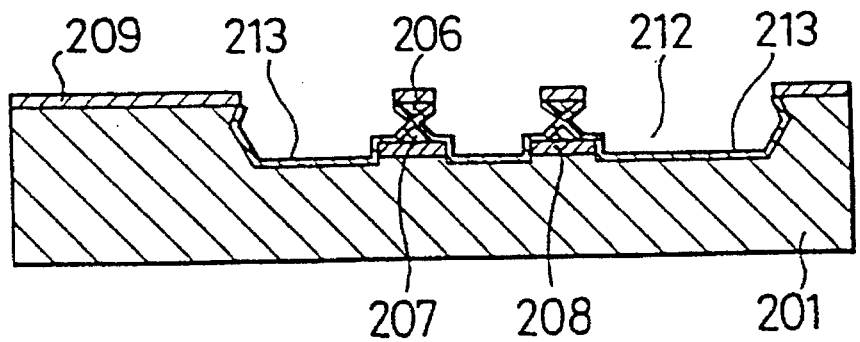

In FIG. 12c, an anisotropic etching of the resulted substrate 201 is carried out with the upper silicon oxide films 209 as the mask by using an alkaline etching solution including hydrazine or ethylenediamine to form upper etching holes 212 having side surfaces of the (111) surface and also upper and lower stopper members 206 and 207 having a triangular cross section defined or surrounded by the silicon oxide film 209 or the $p^+$-type silicon regions 208 and the (111) surfaces in the same manner as described above. Then, the surfaces of the upper etching holes 212 formed in the upper half portion of the substrate 201 are oxidized by the thermal oxidation or the CVD to form silicon oxide films 213 for protecting the upper etching holes 212 from the etching in the same manner as described above.

Figure 12D:
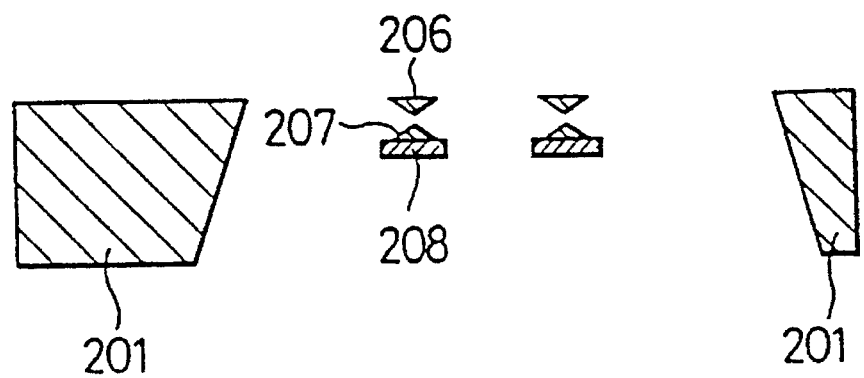

In FIG. 12d, a lower silicon oxide film (not shown) is formed on the lower surface of the substrate 201, and the lower silicon oxide film is partially removed by photoetching to form an opening portion for forming a lower etching hole in the same manner as described above. Then, the anisotropic etching of the resultant substrate 201 is carried out by using the upper and lower silicon oxide films 209 and the silicon oxide protecting films 213 as the mask in the same manner as described above to form a lower etching hole up to the silicon oxide protecting films 213. In this step, since the $p^+$-type silicon regions 208 are stable against the anisotropic etching, the $p^+$-type silicon regions 208 are not removed. Then, the upper and lower silicon oxide film and the silicon oxide protecting films 213 are removed to obtain a semiconductor accelerometer according to the present invention.

In this embodiment, the upper and lower stopper members 206 and 207 defined or surrounded by one flat (100) surface and two slant (111) surfaces are readily formed together with the cantilevered beam 202 and the weight 203 with high accuracy at almost the same time. Hence, when the chips are handled, the destruction of the cantilevered beam can be effectively prevented, and the production of the chips can be largely improved. Further, in this embodiment, separated stoppers and bonding step thereof are not necessary, and the semiconductor accelerometer can be fabricated in a simple process at low cost.

What is claimed is:

1. A semiconductor accelerometer, comprising:

a silicon semiconductor substrate as a frame having a (100) surface;

a weight formed in the substrate and surrounded by the substrate with a gap therebetween;

a silicon cantilevered beam formed in the substrate for connecting the weight to the substrate; and a strain sensing device formed in a surface portion near a support portion of the cantilevered beam, the silicon cantilevered beam having a triangular cross section defined by one (100) surface and two (111) surfaces.

2. The accelerometer of claim 1, wherein the triangular cross section has an inverted triangular shape defined by one flat upper (100) surface and two slant lower (111) surfaces.

3. The accelerometer of claim 1, also including stoppers formed between the substrate and the weight in both side portions and one end portions of the weight, each stopper including upper and lower stopper members having a triangular cross section defined by one (100) surface and two (111) surfaces and being arranged in the same direction as a bending direction of the weight with a certain gap between the upper and lower stopper members, the upper and lower stopper members projection from the weight and the substrate, respectively.

4. The accelerometer of claim 3, wherein said each lower stopper member includes a $p^+$-type silicon region situated below the one (100) surface of said each lower stopper member.

5. The accelerometer of claim 1, wherein said triangular cross section does not vary substantially along a longitudinal axis of said cantilevered beam.

6. A semiconductor accelerometer, comprising:

a silicon semiconductor substrate as a frame having a (100) surface;

a weight formed in the substrate and surrounded by the substrate with a gap therebetween;

a silicon cantilevered beam formed in the substrate for connecting the weight to the substrate; and a strain sensing device formed in a surface portion near a support portion of the cantilevered beam, the silicon cantilevered beam having a pentagonal cross section defined by one (100) surface, two (110) surfaces and two (111) surfaces.

7. The accelerometer of claim 6, wherein the pentagonal cross section is defined by one flat upper (100) surface, two vertical intermediate (110) surfaces and two slant lower (111) surfaces.

8. The accelerometer of claim 6, also including stoppers formed between the substrate and the weight in both side portions and one end portions of the weight, each stopper including upper and lower stopper members having a triangular cross section defined by one (100) surface and two (111) surfaces and being arranged in the same direction as a bending direction of the weight with a certain gap between the upper and lower stopper members, the upper and lower stopper members projecting from the weight and the substrate, respectively.

9. The accelerometer of claim 8, wherein said each lower stopper member includes a $p^+$-type silicon region situated below the one (100) surface of said each lower stopper member.

10. The accelerometer of claim 6, wherein said pentagonal cross section does not vary substantially along a longitudinal axis of said cantilevered beam.

* * * * *